METHOD OF PRODUCING SEMICONDUCTOR CIRCUITS
WITH CONDUCTANCE PATHS
Filed Oct. 13, 1970

United States Patent Office 3,689,332
Patented Sept. 5, 1972

3,689,332

METHOD OF PRODUCING SEMICONDUCTOR CIRCUITS WITH CONDUCTANCE PATHS

Manfred Dietrich, Ottobrunn, Helmut Eger, Olching, and Eckart Neubert and Wolfgang Kruger, Munich, Germany, assignors to Siemens Aktiengesellschaft, Berlin, Germany Filed Oct. 13, 1970, Ser. No. 80,402
Claims priority, application Germany, Oct. 29, 1969, P 19 54 499.1
Int. Cl. H01l 7/50; H05k 3/06
U.S. Cl. 156—11 5 Claims

ABSTRACT OF THE DISCLOSURE

A method of producing integrated circuits with conductance paths wherein an original body is first provided with a metal adhesive layer, then with a layer which, preferably acts as a barrier and, finally, with a gold layer which forms conductance paths. Prior to depositing the gold layer, a protective layer is applied which is then etched off, with the aid of a masking layer, in the regions provided for the conductance paths. After application of the gold layer, the masking layer and the protective layer are removed outside the conductance paths. Finally, the layer which, preferably serves as a barrier and the adhesive layer, are removed outside the conductance paths.

Our invention relates to a method for the production of integrated circuits with conductance paths, wherein a substrate wafer is first provided with a metallic adhesive layer, then a layer, preferably functioning as a barrier layer, is applied and, finally, a gold layer, which forms conductance paths, is applied.

In a prior art method, a titanium layer is applied on an original semiconductor body, as a metallic adhesive layer and a platinum layer is subsequently applied as a barrier layer. A photoresist layer is applied thereon with the aid of a masking in the regions situated outside the future conductance paths, whereupon the conductance paths are galvanically produced by gold precipitation. Subsequently, the photoresist layer is removed outside the conductance paths, the platinum layer functioning as a barrier, is removed by ionic etching and, finally, the titanium layer, acting as an adhesive layer, is chemically removed. The gold which precipitates during the production of conductance paths, has the tendency to creep below the photoresist on the platinum layer, and to migrate under it, thus, during the fabricating operation, resulting in very large numbers of rejects.

It is also known to deposit a molybdenum layer as a metallic adhesive layer, upon the original semiconductor body and, subsequently, to spray or dust on a very thin gold layer, whereupon the gold precipitation for obtaining conductance paths, and other operations are effected in the afore-described manner with photo masking, during such operations. The tendency is even greater for the gold to creep under the varnish and thereby to effect fabrication failures.

Finally, a method is known, wherein the original body is also first provided with titanium as an adhesive layer and then with platinum, as a barrier layer. The photoresist mask then helps to remove the platinum outside the intended conductance path regions. Then the masking layer, which is situated in the future conductance path regions, is removed and a new photoresist mask is deposited which helps to keep the future conductance path regions free. Subsequently, the conductance paths are produced through a galvanic deposit of gold. Finally, the second masking layer is also removed and the titanium adhesive layer is etched off. This method places exacting demands upon the adjustment accuracy during a double masking process, and is therefore very expensive. In this method, also, the platinum must be chemically removed, which is relatively difficult.

It is the object of the invention to suggest a possible low-cost method of the afore-indicated type, where the creeping under of the masking layer during the galvanic production of the gold conductance paths, will be avoided.

We achieve this in our present invention by applying a protective layer prior to depositing the gold layer. This protective layer is then etched off in the regions provided for the conductance paths, with the aid of a masking layer. Following the subsequent gold deposition, the masking layer and the protective layer are removed outside the conductance paths. The layer which preferably serves as a barrier, as well as the adhesive layer, are processed outside the conductance paths, in a known manner.

Because the protective layer is first applied and only then the masking layer applied, the gold is prevented, during the production of the conductance paths, from creeping beneath the masking layer. Also, to remove a possible titanium layer, the simpler and more reliable ionic etching method may be used.

The protective layer may consist of molybdenum. This is of particular advantage when titanium is used as an adhesive layer and platinum as a barrier layer. As a matter of fact, the platinum deposit may not be uniform, during fabrication and may have error localities. If titanium were used here as a protective layer, then the titanium adhesive layer would suffer damage through the platinum error localities, during the subsequent removal, by etching, of the titanium protective layer. This is avoided with reliability by using a molybdenum protective layer.

Aluminum or silicon dioxide, for example, may also be used besides molybdenum and titanium, as protective layers.

The invention will be explained in examples, with reference to the drawing, wherein.

Figure 1:
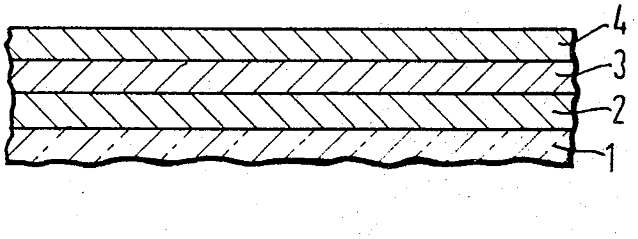
FIG. 1 shows an original semiconductor body with a successively vapor deposited titanium, platinum and molybdenum layers.
Figure 2:
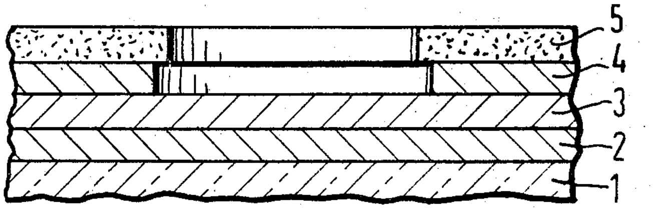
FIG. 2 shows the original semiconductor body following the application of the photoresist masking and the etching away of the molybdenum layer.
Figure 3:
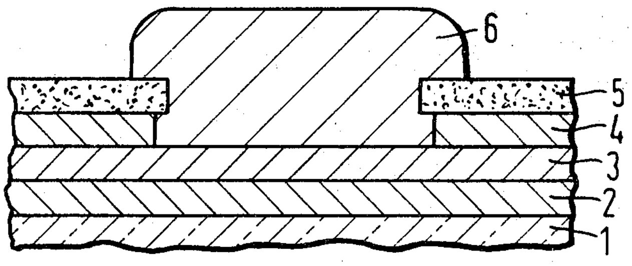
FIG. 3 is the original semiconductor body, following the production of the conductance paths.
Figure 4:
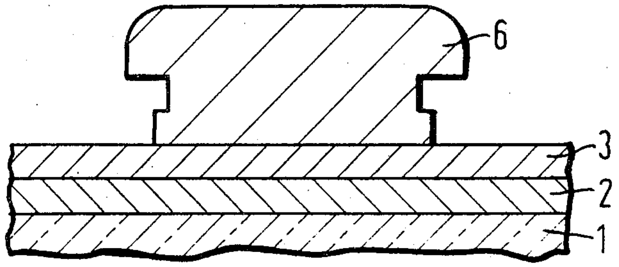
FIG. 4 is the original semiconductor body with the conductance paths, following the removal of the photoresist mask and the etching away of the molybdenum layer.
Figure 5:
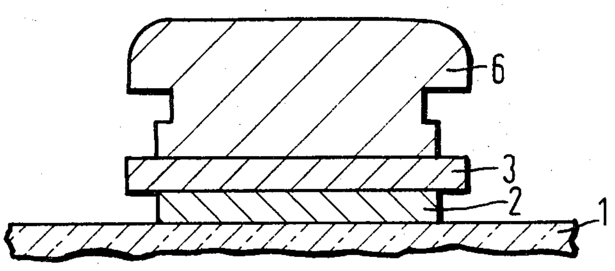
FIG. 5 shows the finished conductance path structure, after the platinum layer was removed by ionic etching and the titanium layer by chemical etching.

A titanium layer, serving as an adhesive layer and a platinum layer, which functions as a barrier 3, are successively deposited on a semiconductor original body 1, by evaporation or cathode sputtering. Both layers are applied over the entire area of the semiconductor body. These two carrier layers are provided, also in total area application, with a molybdenum layer 4, which also serves as a protective layer. This layer is sprayed on at a thickness of 500 A. Now a photoresist mask is formed with a masking layer 5, where the future conductance path regions, to be gold plated, are kept exposed (FIG. 2). The latter are now chemically etched out of the protective layer 4. Without removing the masking layer 5, a gold layer 6 is galvanically deposited for the conductance paths (FIG. 3). Thereupon, the masking layer 5 is removed outside the conductance paths, the protective layer 4 is chemically etched off (FIG. 4), the barrier layer 3 is removed by ionic etching and the adhesive layer 2 is chemically removed (FIG. 5).

To replace the molybdenum layer as a protective layer 4, all materials are suitable, which can either not be galvanically gold plated, for example, aluminum or silicon dioxide, or which, at least, may be adequately passivated on the surface during etching, so that a precipitation of gold is reliably prevented during the masking with photoresist (for example molybdenum or titanium). Moreover, the protective layer 4 may not react with the layer to be gold plated (in the present embodiment example with platinum, for example) at the appertaining temperatures. Otherwise, difficulties will occur during the chemical etching of the protective layer 4. Thus, especially the double layers of molybdenum/gold, titanium/platinum and aluminum/platinum, are particularly suitable as carrier layers on the original body. Also, the protective layer 4 should be etchable, without causing damage, through lower lying error localities, in the underlying carrier layer. This is especially the case, when a molybdenum protective layer is used in a platinum/titanium original base layer.

We claim:

1. A method of producing integrated circuits with conductance paths, wherein first an original body is provided sequentially with a titanium adhesive layer, a platinum layer which, acts as a barrier and a gold layer, which forms conductance paths, which comprises applying a protective layer of molybdenum, aluminum, titanium, or silicon dioxide, etching away with the aid of a photoresist masking layer, said protective layer regions provided for the conductance paths, depositing the gold layer, removing the photoresist masking layer and the protective layer outside the conductance paths, and thereafter finally removing the platinum layer and the titanium layer outside the conductance paths.

2. The method of claim 1, wherein molybdenum is the protective layer.

3. The method of claim 1, wherein aluminum is the protective layer.

4. The method of claim 1, wherein titanium is the protective layer.

5. The method of claim 1, wherein silicon is the protective layer.

References Cited

UNITED STATES PATENTS

| | | | |
|---|---|---|---|
| 3,287,612 | 11/1966 | Lepselter | 317—234 |
| 3,388,048 | 6/1968 | Szabo | 317—234 |
| 3,436,285 | 4/1969 | Wilkes | 156—17 |
| 3,430,334 | 3/1969 | Douta et al. | 29—577 |

OTHER REFERENCES

Connecting Cond. Pattern to Substrate, vol. 10, No. 9, February 1968, p. 1428, Addy et al.

Metals Resists for $SiO_2$ Etchg., vol. 12, No. 12, May 1970, p. 2087, Kaplan.

JACOB H. STEINBERG, Primary Examiner

U.S. Cl. X.R.

156—3, 17; 317—234/5.3; 117—212, 217